US008603723B2

(12) United States Patent
Chang et al.

(10) Patent No.: US 8,603,723 B2
(45) Date of Patent: Dec. 10, 2013

(54) IMAGE TRANSFER PROCESS

(75) Inventors: Hsi-Wen Chang, Tucheng (TW); Wei-Jen Lai, Tucheng (TW); Pi-Ju Chiang, Tucheng (TW); Chun-Hung Lin, Tucheng (TW); Jung Ya Hsieh, Jhubei (TW)

(73) Assignees: Taiwan Textile Research Institute, Tucheng, Taipei County (TW); Gixia Innovation Co., Ltd., Jhubei, Hsinchu County (TW)

( * ) Notice: Subject to any disclaimer, the term of this patent is extended or adjusted under 35 U.S.C. 154(b) by 422 days.

(21) Appl. No.: 13/014,285

(22) Filed: Jan. 26, 2011

(65) Prior Publication Data

US 2012/0189958 A1 Jul. 26, 2012

(51) Int. Cl.

*G03C 5/16* (2006.01)
*G03F 1/00* (2012.01)
*G02F 1/03* (2006.01)

(52) U.S. Cl.

USPC .................................. 430/139; 430/7; 430/20

(58) Field of Classification Search

USPC .................................... 430/270.1, 7, 20, 139
See application file for complete search history.

(56) References Cited

U.S. PATENT DOCUMENTS

| | | | | |
|---|---|---|---|---|
| 7,846,639 | B2 * | 12/2010 | Lungu | 430/271.1 |
| 8,193,010 | B2 * | 6/2012 | Gopal et al. | 438/21 |
| 2006/0154180 | A1 * | 7/2006 | Kannurpatti | 430/311 |
| 2009/0134227 | A1 * | 5/2009 | Roth | 235/491 |
| 2010/0117110 | A1 * | 5/2010 | Park et al. | 257/98 |
| 2010/0291331 | A1 * | 11/2010 | Schaefer | 428/35.7 |
| 2012/0033403 | A1 * | 2/2012 | Lamvik et al. | 362/84 |
| 2013/0027723 | A1 * | 1/2013 | Coyle | 358/1.9 |

* cited by examiner

*Primary Examiner* — Amanda C. Walke
(74) *Attorney, Agent, or Firm* — Foley & Lardner LLP

(57) ABSTRACT

The present invention relates to an image transfer process. The process includes the steps of: a) providing an image carrying device including at least one photoluminescent surface; b) displaying a luminous image on a display surface of a light-emitting medium; and c) positioning the display surface of the light-emitting medium that is displaying the luminous image at a distance from the at least one photoluminescent surface of the image carrying device shorter than a predetermined effective distance, for a predetermined period of time.

9 Claims, 8 Drawing Sheets

IMAGE TRANSFER PROCESS

FIELD OF THE INVENTION

The present invention relates to an image transfer process, and more particularly, to an image transfer process that is accomplished by using the photoluminescence technology.

DESCRIPTION OF THE RELATED ART

When a substance absorbs light with higher frequency, some electrons present in the substance's molecules that receive energy from photons striking them are excited from a low-energy ground state to a high-energy excited state and then return back to the ground state, by which photons with lower energy are emitted to effect self-luminescence of the substance. The self-luminescence would continue for a while if the substance is irradiated for a sufficient period of time to absorb energy from photons. This luminescence phenomenon arising from light-irradiation is referred to as "photo-luminescence". In addition, it is possible to emit light of different colors by properly choosing photo-luminescent materials differing in ground-to-exited state transition energy.

Manufacturers have incorporated the photo-luminescent materials described above into conventional products to develop new products with self-luminescent property. As shown in FIG. 1, a plastic material is mixed with the a photo-luminescent material and press printed onto a textile surface to produce a verbal or figurative design 9, which may by way of example be a stylized "S" mark typically used to symbolize a famous comic character, Superman. When irradiated by daylight or outdoor/indoor lighting, the textile surface will reveal the stylized "S" mark at night or dark environment. However, the photo-luminescent materials each emit light at a specific wavelength, meaning that the color of the image 9 cannot be changed arbitrarily. Moreover, since ordinary lighting is normally irradiated evenly over the entire piece of textile fabric, the photo-luminescent materials are all press printed onto the textile fabric to form a predetermined fixed pattern and, therefore, the textile fabric can only show the fixed pattern without any possibility of adjustment. Worse still, the admixture of a plastic material and a photo-luminescent material will impart an undue stiffness to the patterned area of the textile fabric and give a stiff and rough feeling, resulting in low market acceptance.

On the other hand, although a conventional display device is capable of partitioning an image into a number of pixel data and then rebuilding the image by adjusting the brightness and chromaticity of the respective pixels, it requires a light source or a backlight source to clearly display the image. It is impracticable to either put a display device on the body or incorporate the display device into a commodity product, in view of the weight and inconvenience of carrying it.

Therefore, there exists a need for a piece of fabric that can demonstrate a variety of luminescent verbal and figurative patterns of the users' choice. The piece of fabric may be fabricated into a glamorous party outfit or serve as an attractive human bulletin board. A person who wears the piece of fabric can express himself by demonstrating the words or pictures of his choice. There also exists a need for a commodity product that can demonstrate a variety of verbal and figurative patterns of the users' choice at dark areas. Products of these types will undoubtedly attract public attention. The invention provides the best solution to the need by providing an image transfer process accomplished by using the photoluminescence technology. The invention simply employs an image carrying device and a light-emitting medium to present particular words or pictures at a particular moment as per the user's desire.

SUMMARY OF THE INVENTION

Accordingly, an object of the present invention is to provide a customized image transfer process allowing an image carrying device to demonstrate a variety of luminescent image patterns upon receiving a variety of corresponding image patterns.

Another object of the invention is to provide an image transfer process, which involves provision of grayscale image data composed of a great number of shades of gray transfer to an image carrying device, thereby allowing the image carrying device to demonstrate a corresponding verbal or figurative luminescent pattern with high delicacy.

It is still another object of the invention to provide an image transfer process, which allows an easy duplication of a specific verbal or figurative luminescent pattern on a number of image carrying devices.

The present invention therefore provides an image transfer process. The process comprises the steps of: a) providing an image carrying device including at least one photoluminescent surface; b) displaying a luminous image on a display surface of a light-emitting medium; and c) positioning the display surface of the light-emitting medium that is displaying the luminous image at a distance from the at least one photoluminescent surface of the image carrying device shorter than a predetermined effective distance for a predetermined period of time.

The image transfer process according to the invention allows the photoluminescent surface of the image carrying device to demonstrate a specific verbal or figurative luminescent pattern. The invention further allows the image carrying device to present a variety of verbal or figurative luminescent patterns at specific occasions as per the user's desire. By virtue of the invention, the image carrying device described herein can demonstrate a variety of verbal or figurative luminescent patterns and becomes an innovative and personalized product.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE INVENTION

Figure 1:
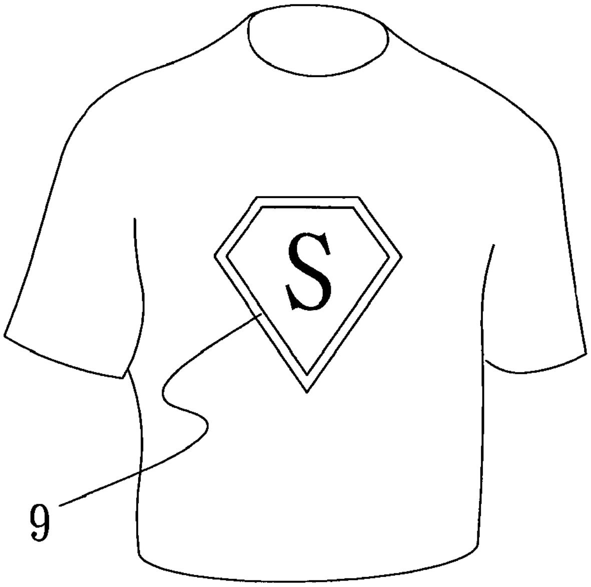
PRIOR ART FIG.1
FIG. 1 is a schematic diagram showing a piece of conventional cloth printed with a luminescent pattern.
Figure 2:
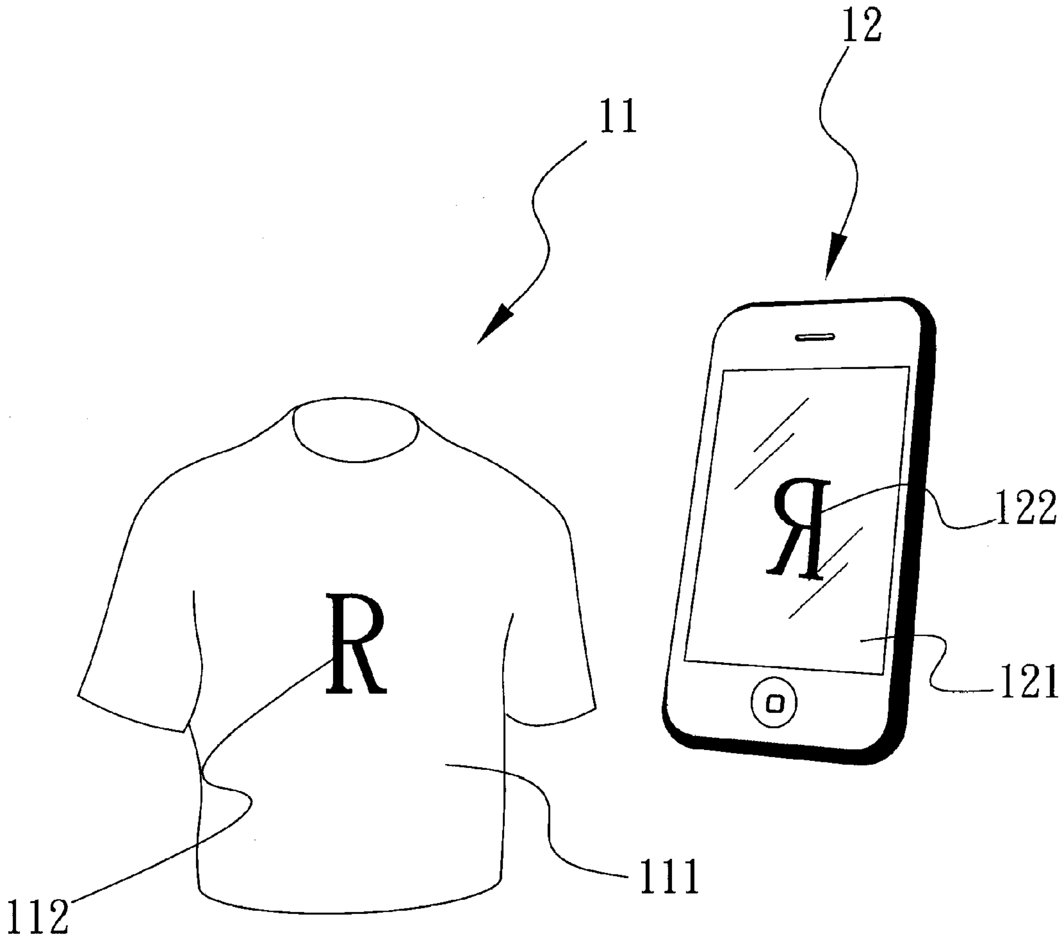
FIGS. 2 and 3 are schematic working diagrams according to the first preferred embodiment of the invention.

FIG. 2 is a schematic diagram for the first preferred embodiment of the invention, in which the image carrying device is by way of example configured to be a piece of T-shirt 11. Since the T-shirt is woven by a plurality of fibers and at least some of the fibers contain a photoluminescent dye, it will emit luminescent light upon receipt of external illumination. This T-shirt, which may be made pure white, is then turned out to be a photoluminescent surface 111 without a predetermined pattern. On the other hand, the light-emitting medium 12 according to the invention is a smart phone having a liquid crystal display surface 121 composed of plural pixels.

Figure 3:
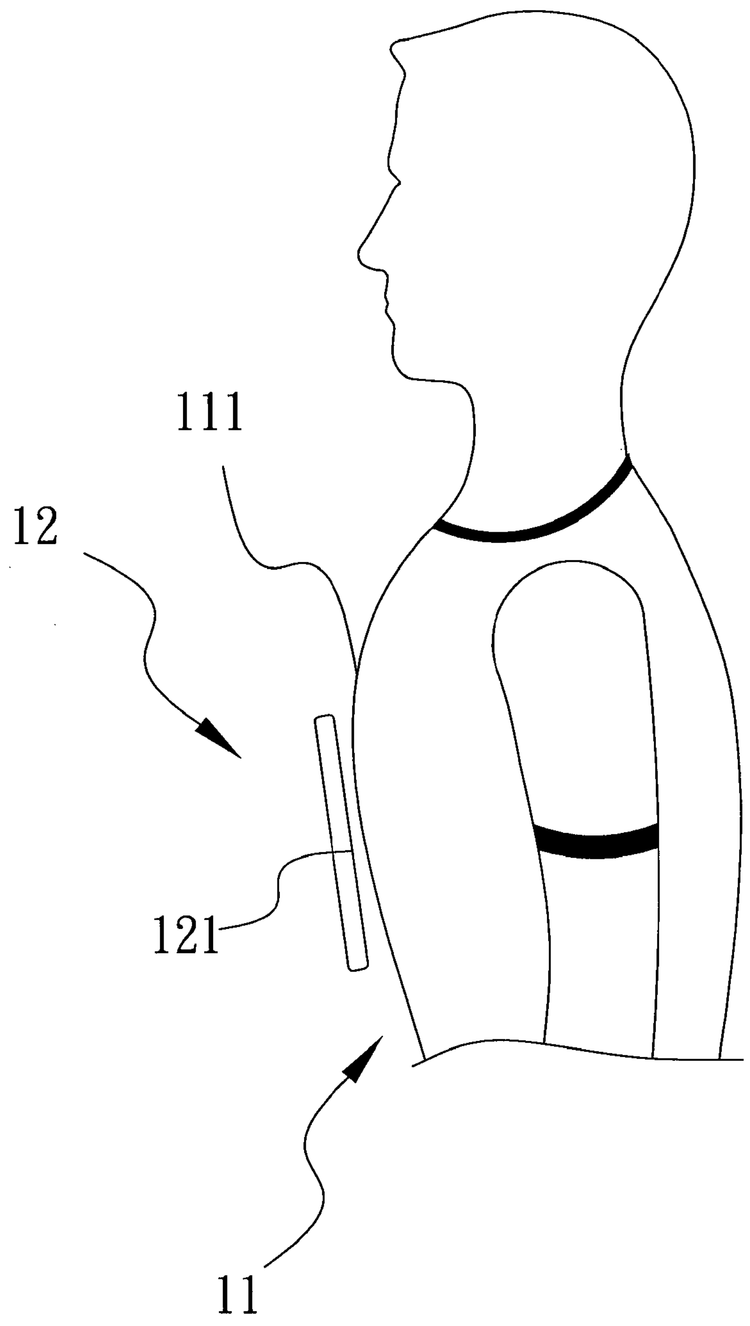

As shown in FIG. 3, the imager transfer process according to the invention is effected by using the smart phone to download image data and provide the image data to the liquid crystal display surface 121, allowing the surface 121 to display a luminous image corresponding to the image data, and then exposing the luminous image to a surface of the T-shirt. In this embodiment, the luminous image is exposed to a surface of the T-shirt by positioning the liquid crystal display surface 121 intimately close to the T-shirt's surface for a period of time, such as 1 minute, so as to prevent the light emitted from the LCD pixels from diverging due to distance. As such, the photoluminescent dye present in the T-shirt is activated upon receiving direct illumination from the liquid crystal display surface 121 and reveals a mirror image of the luminous image displayed on the surface 121 after removal of the light-emitting medium 12, as shown in FIG. 2. If the luminous image 122 includes a verbal pattern, the T-shirt would show a left-to-right flipped verbal image 112.

Figure 4:
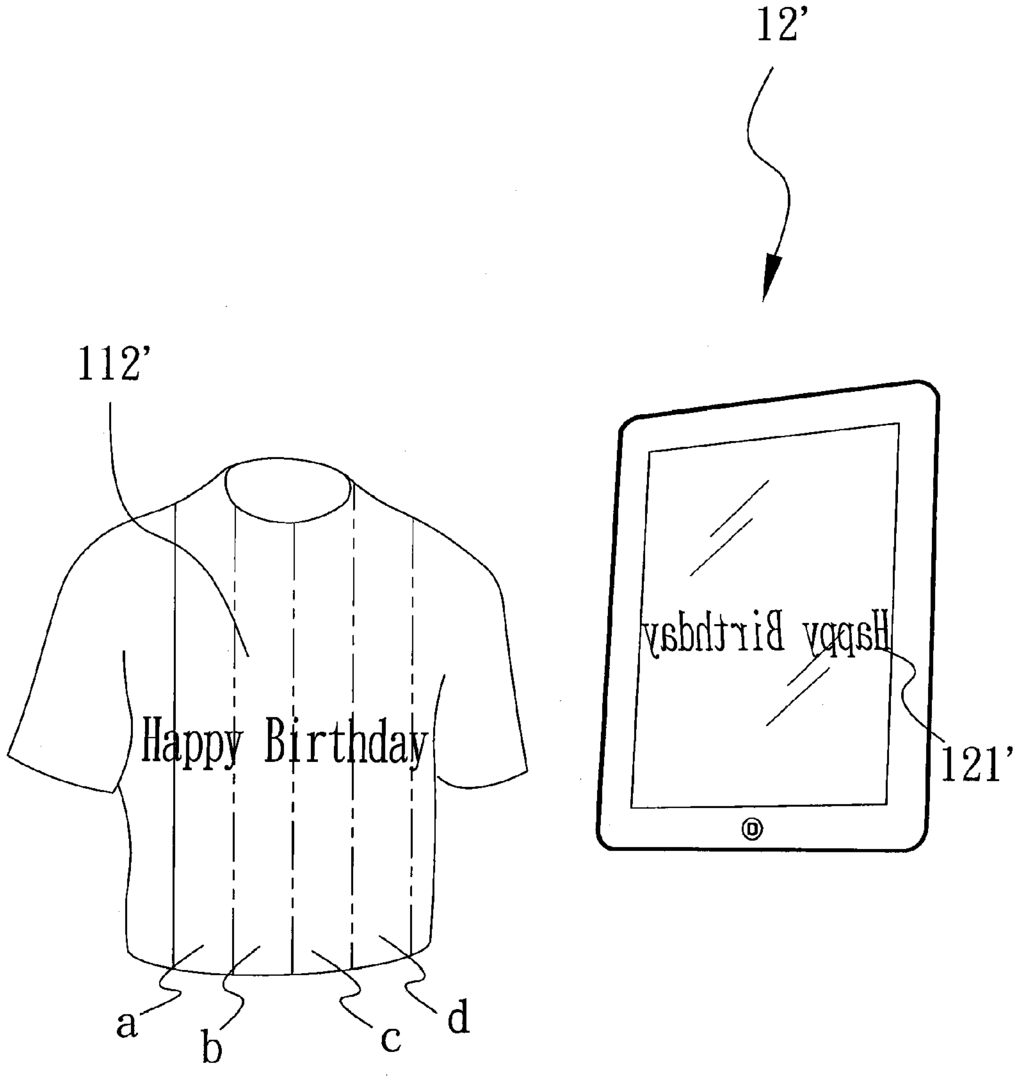
FIG. 4 is a schematic working diagram according to the second preferred embodiment of the invention, showing an image carrying device having a photoluminescent surface that presents varied colors from one of the color regions to another.

Furthermore, in order to make the image carrying device more colorful, the image carrying device according to the second preferred embodiment illustrated in FIG. 4 is configured as a piece of T-shirt, which is woven by various kinds of fibers doped with photoluminescent dyes having different emission spectra and, thus, includes a plurality of color regions a, b, c, d presenting different colors from one another. When a tablet personal computer 12' is employed to download image data and present the same on the liquid crystal display device 121' thereof, the image 112' revealed on the T-shirt will have varied colors from one of the color regions a, b, c, d to another. It is apparent to those having ordinary skill in the art that in order to prolong the duration of the image presented on the image carrying device, it is preferably to increase the contrast of the brightest part of the luminous image displayed on the LCD device 121' to the darkest part of the image as maximum as possible. More preferably, a black-and-white luminous image with high contrast is used herein instead of a color image.

Figure 5:
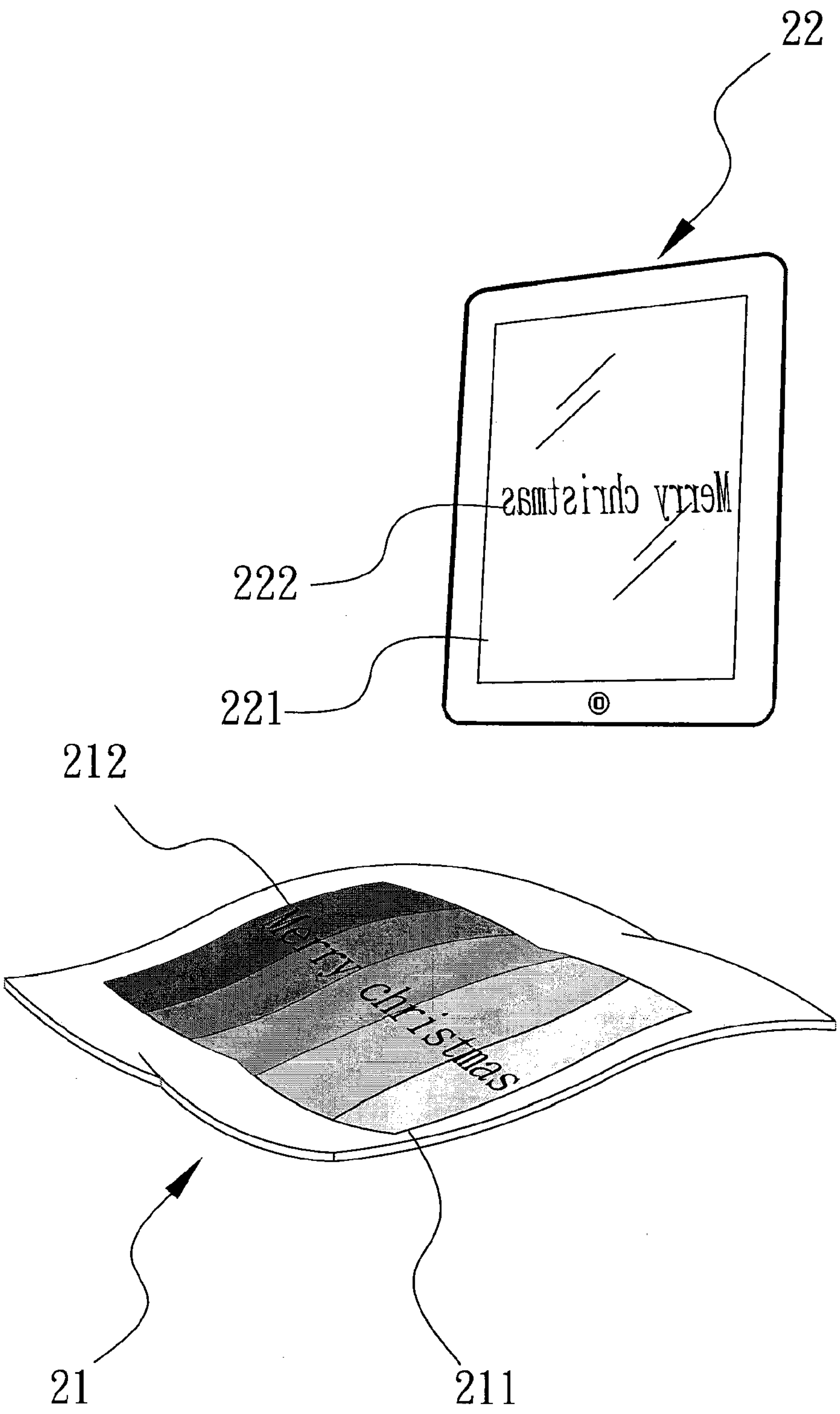
FIGS. 5 and 6 are schematic working diagrams according to the third preferred embodiment of the invention.
Figure 6:
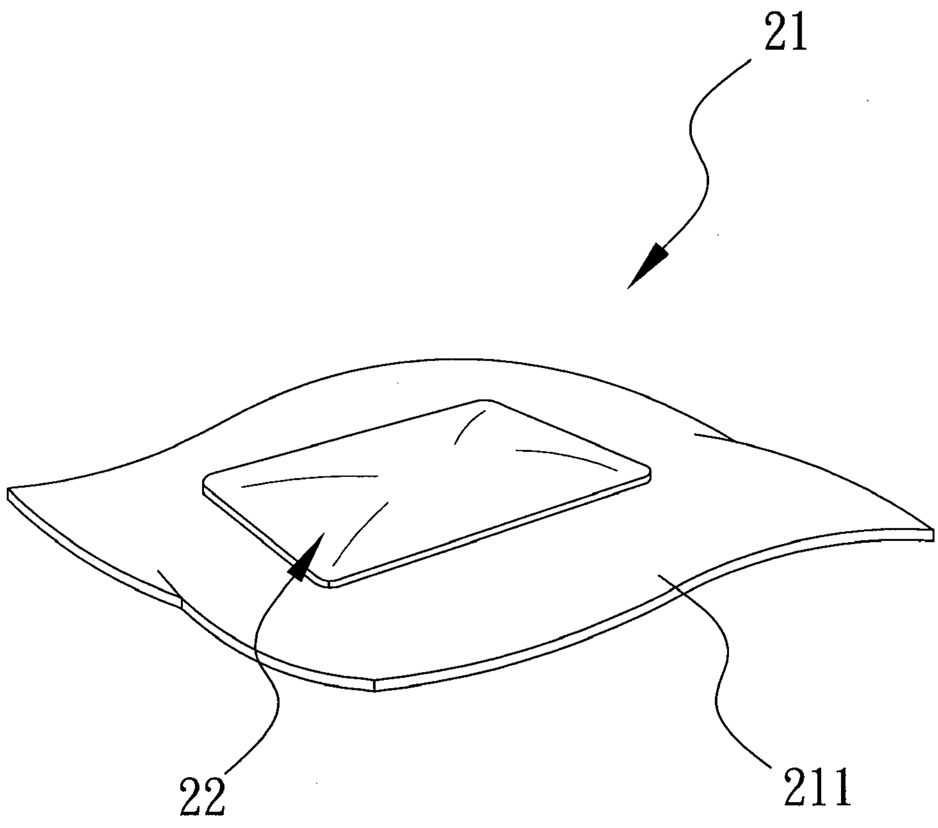

It is apparent to those skilled in the art that the image carrying device described herein is not limited to a piece of cloth. According to the third preferred embodiment of the invention shown in FIGS. 5 and 6, the image carrying device is configured to be a placemat 21, whose central region has a photoluminescent surface 211 press printed with a photoluminescent material. In this embodiment, the light-emitting medium is illustrated as a tablet personal computer 22. During the Christmas Holidays, for example, a restaurant may download image data designed to display a luminous mirror image of a "Merry Christmas" text, allow a display surface 221 of the tablet personal computer 22 to display the mirror image and then expose the mirror image to the placemat 21 by positioning the display surface 221 in close proximity to the placemat 21, thereby allowing the photoluminescent surface 211 to demonstrate a text image 212. The use of the placemat 21 would provide great help in decorating restaurant setting and creating a pleasant dining environment.

The placemat disclosed herein is so versatile that it can be customized to fulfill different social purposes, such as greetings for special days, expressing love for beloved ones and proposing a marriage. Furthermore, the photoluminescent surface 211 described herein is fabricated to have a gradual change in the density of the photoluminescent material printed thereon along a particular direction, so that the text image 212 revealed on the placemat 21 will create a color gradient effect to thereby improve the dining environment even more.

Figure 7:
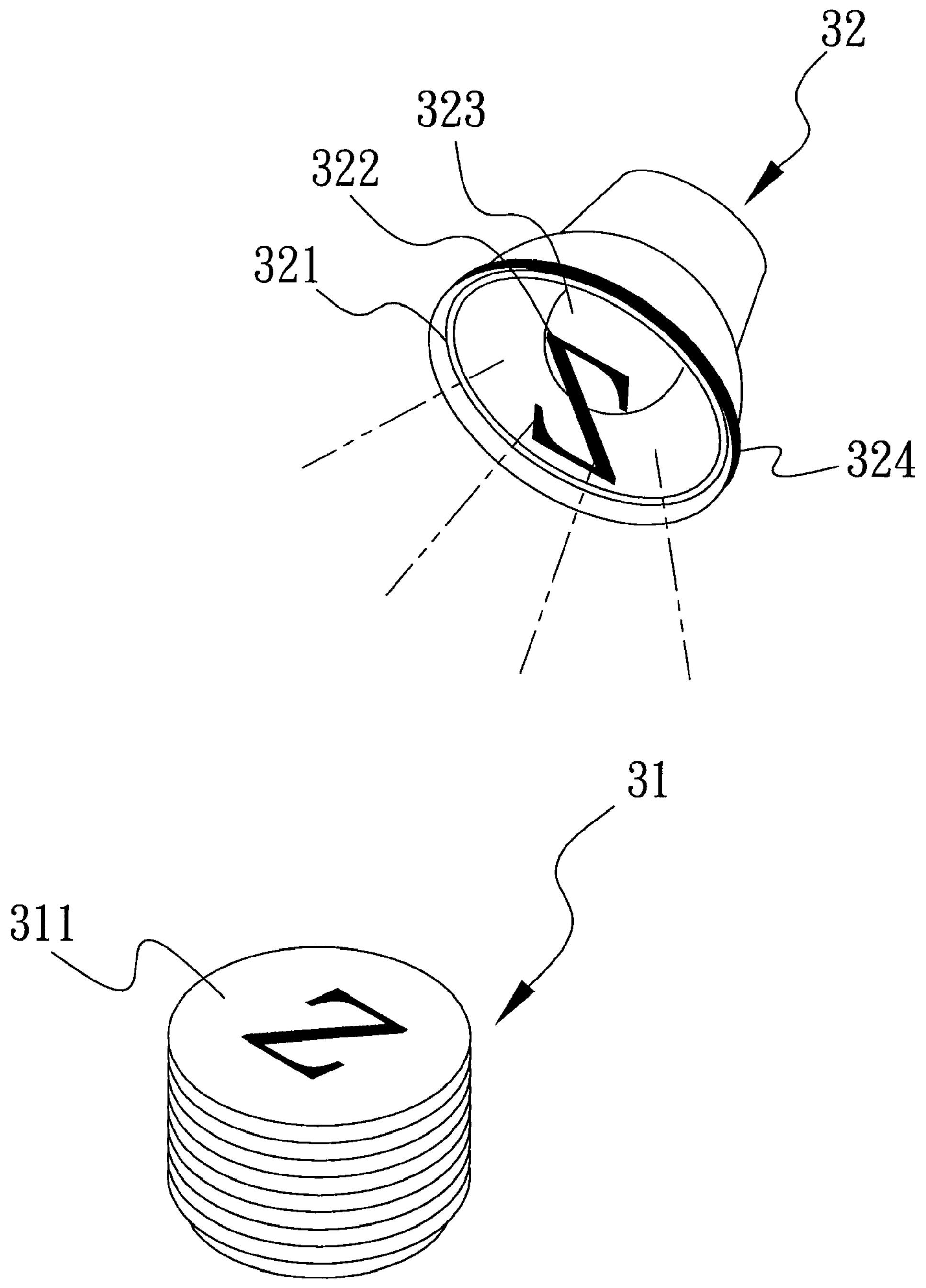
FIG. 7 is a schematic working diagram according to the fourth preferred embodiment of the invention, showing that an image pattern is transferred to a placemat under a light-emitting medium comprising an ultraviolet lamp.

The image carrying device described herein is not necessarily limited to a piece of cloth and a placemat. According to the fourth preferred embodiment of the invention shown in FIG. 7, the image carrying device is configured to be a dining plate 31 provided with a photoluminescent surface, on which a photoluminescent layer 311 is disposed. The dining plate 31 is additionally coated with a transparent protective layer to cover up the photoluminescent layer 311, as a means to eliminate the possibility of food being contaminated by photoluminescent dyes and also prolong the lifespan of the photoluminescent layer 311 coated on the dining plate 31. According to this embodiment, an ultraviolet lamp 323 is employed as a light source, in front of which is a shield plate 324 formed with a through hole allowing the light emitted from the ultraviolet lamp 323 to pass through and shaped to correspond to a verbal or figurative pattern. A side of the shield plate 324 that is arranged away from the light source 323 is defined to be a display surface 321.

The light source 323 and the shield plate 324 described above together constitute a light-emitting medium 32, which is capable of presenting a luminous image 322 on the display surface 321 by adjusting the size, shape or optical transparency distribution of the through hole. When a number of dining plates 31 are stacked together under the ultraviolet lamp 323 at a distance of, for example, about 10 centimeters, the ultraviolet lamp 323 will not only provide microbiocidal activity against pathogens, but also allow the UV luminous image 322 to project onto the dining plate 31 placed uppermost in the stack, thereby rendering the photoluminescent layer 311 of the uppermost dining plate 31 to demonstrate a mirror image of the luminous image 322. Preferably, the brightness of the ultraviolet lamp 323 is adjusted as per the speed of the dining plates 31 being taken away from the stack by customers, such that every dining plate 31 in the stack is sterilized and also transferred with a desired image pattern, such as a restaurant logo and an occasional picture for valentine's day or thanksgiving day.

Figure 8:
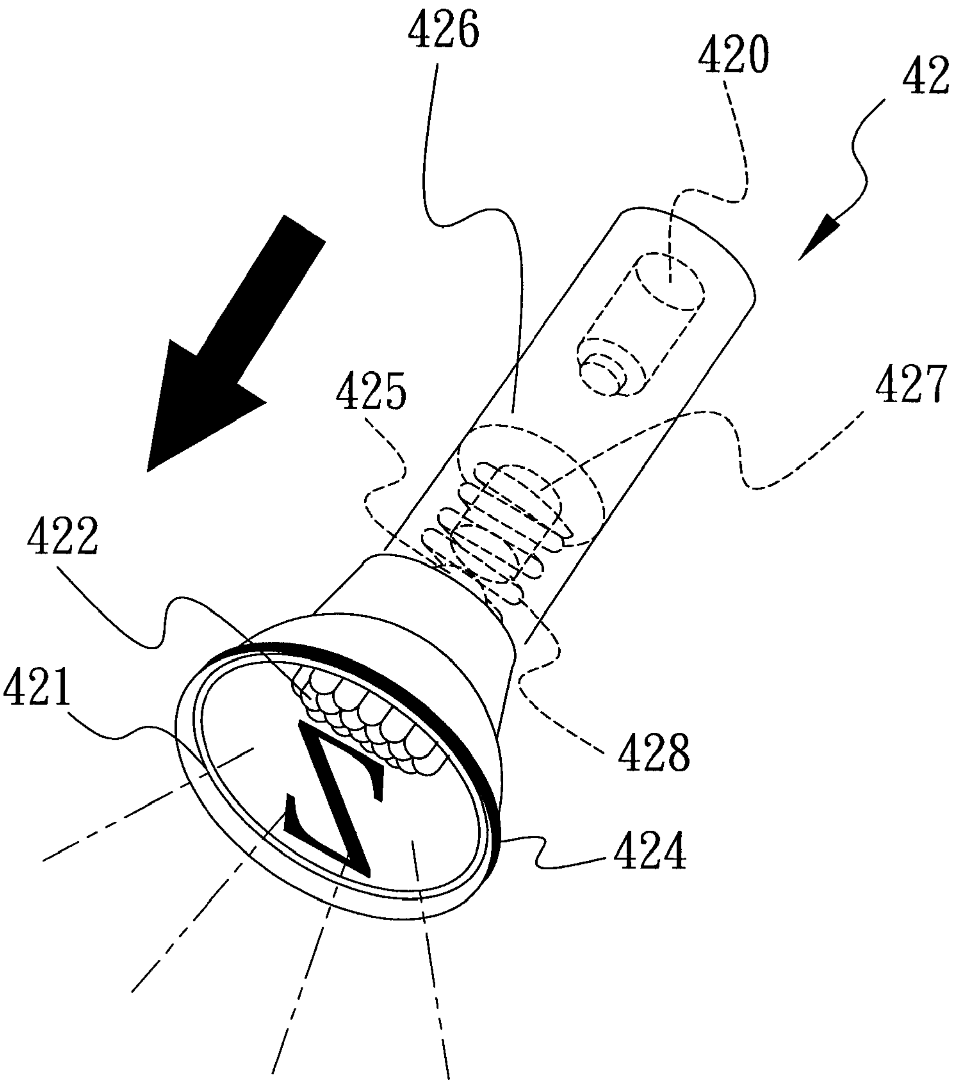
FIG. 8 is a schematic perspective view of a seal-like tool according to the fifth preferred embodiment of the invention.

Moreover, according to the fifth preferred embodiment of the invention as shown in FIG. 8, the light-emitting medium is designed to be a seal-like tool 42, in which a light-emitting diode (LED) device 422 and a battery 420 are mounted. A shield plate 424 is disposed at the light-emitting side of the LED device 422. The shield plate 424 has an outer surface that serves as a display surface 421. The seal-like tool 42 includes a handle 426 configured to be a movable part abutted against an internal spring 428. A protruded portion 427 is formed on the abutting surface in the interior of the handle 426 along the longitudinal direction, so that when the handle 426 is pushed forwards to a maximum position, the protruded portion 427 is brought into contact with an actuation switch 425.

In the case where a user is thinking of transferring the pattern present on the shield plate 424 of the seal-like tool 42 to an image carrying device, such as the piece of T-shirt, the placemat or the dining plate described above, or even a photoluminescent sticker, he can simply place the shield plate 424 in close proximity to the image carrying device and then push the handle 426 forwards. As a result, the LED device 422 of the seal-like tool 42 is turned on, and the light emitted therefrom passes through the display surface 421 to arrive at the photoluminescent surface of the image carrying device. After a 1-minute exposure, for example, the seal-like tool 42 can be removed to complete the image transfer process.

The image transfer process disclosed herein is suitable for use in a banquet, a restaurant, a prom or any occasion that requires a pleasant environment. The invention is so versatile that the image shown on the photoluminescent surface can be changed as per the user's desire. The invention is further advantageous in being cost-effective and providing high flexibility for use in various applications. It is undoubtedly that the invention provides an interesting way for amusement and advertisement purposes. The image transfer process disclosed herein, when applied to a piece of cloth, allows using a portable light-emitting medium to transfer particular words or pictures of the user's choice to the piece of cloth and then demonstrating the same on the piece of cloth. The invention apparently satisfies the needs for fashion and personalized products.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the spirit and scope of the invention.

What is claimed is:

1. An image transfer process comprising the steps of:

a) providing an image carrying device including at least one photoluminescent surface;

b) displaying a luminous image on a display surface of a light-emitting medium, wherein the light-emitting medium is a display device having a plurality of cells, and providing an image data corresponding to the luminous image to the display device; and c) positioning the display surface of the light-emitting medium that is displaying the luminous image at a distance from the at least one photoluminescent surface of the image carrying device shorter than a predetermined effective distance, for a predetermined period of time.

2. The image transfer process according to claim 1, wherein the display device is a liquid crystal display device.

3. The image transfer process according to claim 1, wherein the light-emitting medium comprises:

a light source; and a shield plate formed with a through hole allowing light emitted from the light source to pass through, wherein the display surface is a side of the shield plate arranged away from the light source.

4. The image transfer process according to claim 3, wherein the light source is an ultraviolet lamp.

5. The image transfer process according to claim 1, wherein the luminous image comprises at least one left-to-right flipped verbal image.

6. The image transfer process according to claim 1, wherein the image carrying device is a piece of fabric.

7. The image transfer process according to claim 6, wherein the piece of fabric is woven by a plurality of fibers and at least some of the fibers contain a photoluminescent dye.

8. The image transfer process according to claim 7, wherein the at least some of the fibers contain a plurality of photoluminescent dyes having different emission spectra, so that the at least some of the fibers emit light with various colors upon receiving illumination from the light-emitting medium.

9. The image transfer process according to claim 1, wherein the photoluminescent surface of the image carrying device has a gradual change in density of a photoluminescent dye provided therein along a particular direction, so as to create at least one color gradient zone.

* * * * *